(12) United States Patent
Takabayashi et al.

(10) Patent No.: US 6,307,620 B1
(45) Date of Patent: Oct. 23, 2001

(54) SUBSTRATE HOLDING APPARATUS, SUBSTRATE TRANSFER SYSTEM, EXPOSURE APPARATUS, COATING APPARATUS, METHOD FOR MAKING A DEVICE, AND METHOD FOR CLEANING A SUBSTRATE HOLDING SECTION

(75) Inventors: Yukio Takabayashi, Utsunomiya; Shigeyuki Uzawa, Naka-machi, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/557,972

(22) Filed: Apr. 25, 2000

(30) Foreign Application Priority Data

Apr. 27, 1999 (JP) .................................................. 11-119631

(51) Int. Cl.$^7$ ......................... G03B 27/58; G03B 27/42; G03B 27/60
(52) U.S. Cl. ................................. 355/72; 355/53; 355/73
(58) Field of Search .......................... 355/53, 72, 73, 355/30; 428/469, 701; 502/2; 427/226; 250/453.11, 455.11; 269/21; 378/34

(56) References Cited

U.S. PATENT DOCUMENTS

| | | | |
|---|---|---|---|
| 4,180,482 | * 12/1979 | Nishino et al. | 502/2 |
| 4,544,470 | * 10/1985 | Hetrick | 204/248 |
| 4,969,168 | 11/1990 | Sakamoto et al. | 378/34 |
| 5,131,022 | 7/1992 | Terashima et al. | 378/34 |
| 5,324,012 | * 6/1994 | Aoyama et al. | 269/21 |
| 5,374,829 | * 12/1994 | Sakamoto et al. | 250/453.11 |
| 5,563,683 | * 10/1996 | Kamiya | 355/53 |
| 5,923,408 | 7/1999 | Takabayashi | 355/53 |
| 6,027,766 | * 2/2000 | Greenberg et al. | 427/226 |
| 6,032,715 | * 3/2000 | Ohkubo et al. | 156/538 |
| 6,054,227 | * 4/2000 | Greenberg et al. | 428/701 |
| 6,106,955 | * 8/2000 | Ogawa et al. | 428/469 |

FOREIGN PATENT DOCUMENTS

| | | |
|---|---|---|
| 0 769 322 | 4/1997 | (EP) . |
| 9-168722 | 6/1997 | (JP) . |
| 10-340889 | 12/1998 | (JP) . |
| 11-111593 | 4/1999 | (JP) . |

\* cited by examiner

*Primary Examiner*—Russell Adams
*Assistant Examiner*—Rodney Fuller
(74) *Attorney, Agent, or Firm*—Fitzpatrick, Cella, Harper & Scinto

(57) ABSTRACT

An exposure holding apparatus includes a substrate holding section for holding a substrate. The substrate holding section includes a thin film, which causes a photocatalytic reaction upon irradiation with light. This substrate holding apparatus prevents adhesion of foreign materials, which causes a decrease in yield of device production, and provides a system for rapidly removing the foreign materials.

32 Claims, 9 Drawing Sheets

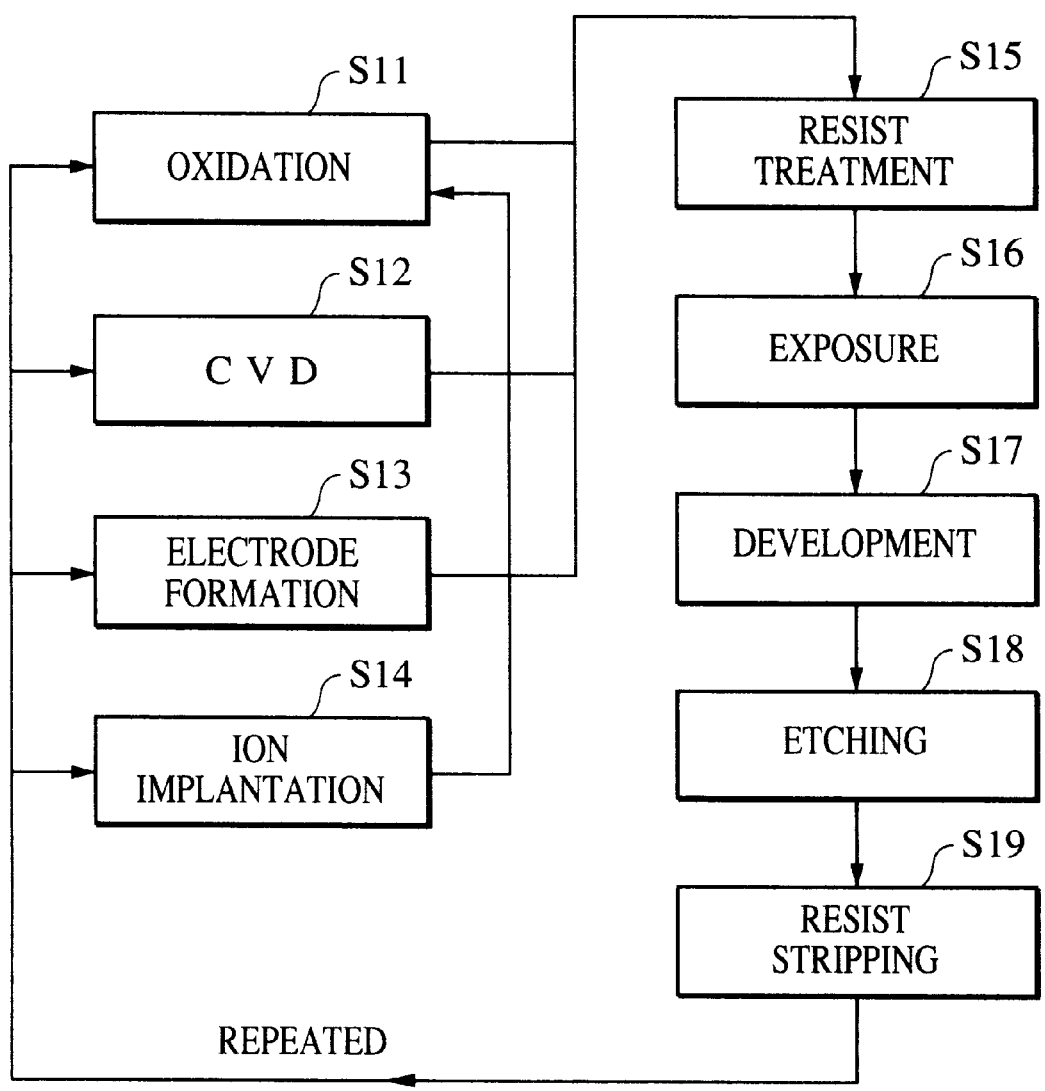

SUBSTRATE HOLDING APPARATUS, SUBSTRATE TRANSFER SYSTEM, EXPOSURE APPARATUS, COATING APPARATUS, METHOD FOR MAKING A DEVICE, AND METHOD FOR CLEANING A SUBSTRATE HOLDING SECTION

BACKGROUND OF THE INVENTION

1. Field of the Invention

The present invention relates to substrate holding apparatuses for holding workpieces. In particular, the present invention relates to a substrate holding apparatus used in apparatuses for making semiconductors, liquid crystal substrates, magnetic heads, micromachines and the like. The present invention also relates to an exposure apparatus and a method for making a device using the substrate holding apparatus. Moreover, the present invention relates to a method for cleaning a substrate holding section.

2. Description of the Related Art

The wavelength of exposure light sources is currently shifting from 365 nm of the i-line to 248 nm of the KrF laser. Next generation light sources of a shorter wavelength are also being developed. Laser light having a wavelength that is shorter than the wavelength of the KrF laser significantly damages optical elements, resulting in increased operation cost. Thus, in addition to the trend of light sources towards shorter wavelengths, development of high-resolution exposure apparatuses is directed to high numerical aperture (NA) projection optical systems. The effective depth of focus of the optical system, however, decreases as the NA increases. Thus, in order to achieve a sufficiently large depth of focus, the process tolerances must be maintained as much as possible by suppressing the curvature of field in the optical system and by improving the uniformity of the substrate thickness and the planar precision of a chuck.

In consideration of such circumstances, incidental incorporation of foreign materials between a wafer and the chuck must be avoided in order to assure a practical depth of focus. Various types of foreign materials, such as resists and worn parts formed by sliding of a contact portion of a transfer hand, may be adhered to the rear surface of the wafer during steps prior to the exposure steps. It is difficult to determine (1) where foreign materials are adhered and (2) the sizes of the foreign materials. Further, foreign materials interposed between the wafer and the chuck cause significant effects. For example, when a foreign material having a particle size of 1 μm is interposed, the wafer rises over a region having a diameter of 12 mm from the center of the foreign material, resulting in decreased resolution. If the foreign material remains on the chuck, wafer defects will occur at the same position on many wafers.

In conventional apparatuses, grinders provided for cleaning slide on the surface of the chuck, under pressure, in order to remove the foreign materials adhered to the chuck by directly scraping off the foreign materials. This cleaning process is performed manually or automatically and causes a decrease in throughput due to the apparatus being shut down during the cleaning process.

SUMMARY OF THE INVENTION

It is an object of the present invention to provide a means for preventing adhesion of foreign materials which causes a decrease in yield of device production, and a means for rapidly removing the foreign materials.

A substrate holding apparatus in accordance with the present invention includes a substrate holding section for holding a substrate, wherein the substrate holding section includes a thin film that causes a photocatalytic reaction upon irradiation with light.

Preferably, the substrate is held at the substrate holding section by vacuum chucking.

Preferably, the thin film is composed of a ceramic material having semiconductor characteristics. Preferably, the thin film is composed of titanium oxide. Preferably, the titanium oxide is heat-treated at 800° C. or less.

Preferably, the substrate holding section is provided on a wafer chuck.

The substrate holding apparatus may further include a pin supporting the substrate. The substrate holding apparatus may further include a projection provided on the pin.

The thin film may be formed at least at a position in contact with the substrate.

In a preferable embodiment, the thin film may be formed at the tip of the pin.

In another preferable embodiment, the thin film may be formed on the periphery of a position in contact with the substrate.

In another preferable embodiment, the thin film may be formed on the periphery of a pin supporting the substrate.

The substrate holding section may be formed at a hand of a transfer system for transferring a wafer.

Preferably, the hand is composed of a ceramic material.

Preferably, the hand is irradiated with ultraviolet rays in a waiting mode.

In another aspect of the present invention, a substrate transfer system includes the above-described substrate holding apparatus.

In another aspect of the present invention, an exposure apparatus includes the above-described substrate holding apparatus.

Preferably, the substrate holding apparatus is moved by a stage.

Preferably, exposure of the substrate holding apparatus is performed while moving the stage stepwise. Alternatively, exposure of the substrate holding apparatus may be performed while scanning a stage.

Preferably, the substrate holding apparatus is cleaned by exposure of the substrate holding apparatus.

Preferably, the substrate holding apparatus is exposed with a light beam having a wavelength of 420 nm or less. Preferably, the light beam is in the i-line.

The exposure apparatus may further include a light irradiation unit for exposing the substrate holding apparatus. In such a case, the light irradiation unit preferably introduces a light beam from a light source, the light source being used for transferring a pattern formed in a reticle onto a wafer, to expose the substrate holding apparatus.

Preferably, the light irradiation unit functions as a means for radiating a light beam for transferring a pattern formed in a reticle onto a wafer.

Preferably, the light irradiation unit exposes the substrate holding apparatus using a light source other than a light source for transferring a pattern formed in a reticle onto a wafer.

Preferably, the substrate holding section is provided in a coating unit for applying a resist solution or a developing solution onto the substrate.

In another aspect of the present invention, a coating unit includes the above-described substrate holding apparatus.

Preferably, a resist solution or a developing solution is applied onto the substrate.

In another aspect of the present invention, a method for making a device includes the steps of providing the above-described exposure apparatus, transferring a pattern formed in a reticle onto a wafer, and exposing the substrate holding apparatus with light causing a photocatalytic reaction.

The method for making a device may further include the steps of applying a resist onto the wafer using a coating unit such as discussed above, and developing the exposed wafer.

In another aspect of the present invention, a method for cleaning a substrate holding section for holding a substrate, includes the steps of moving the substrate holding section provided with a thin film that causes a photocatalytic reaction, into an irradiation region of a light irradiation unit, and irradiating the substrate holding section with light from the light irradiation unit.

Preferably, the substrate holding section is irradiated with the light by using an optical system of an exposure apparatus.

Other features and advantages of the present invention will be apparent from the following description taken in conjunction with the accompanying drawings, in which like reference characters designate the same or similar parts throughout.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a flow chart of a wafer process utilized in the production of the semiconductor device.

DESCRIPTION OF THE PREFERRED EMBODIMENTS

Preferred embodiments of the present invention will now be described in detail in accordance with the accompanying drawings.

Embodiments of a Wafer Chuck

Figure 1:
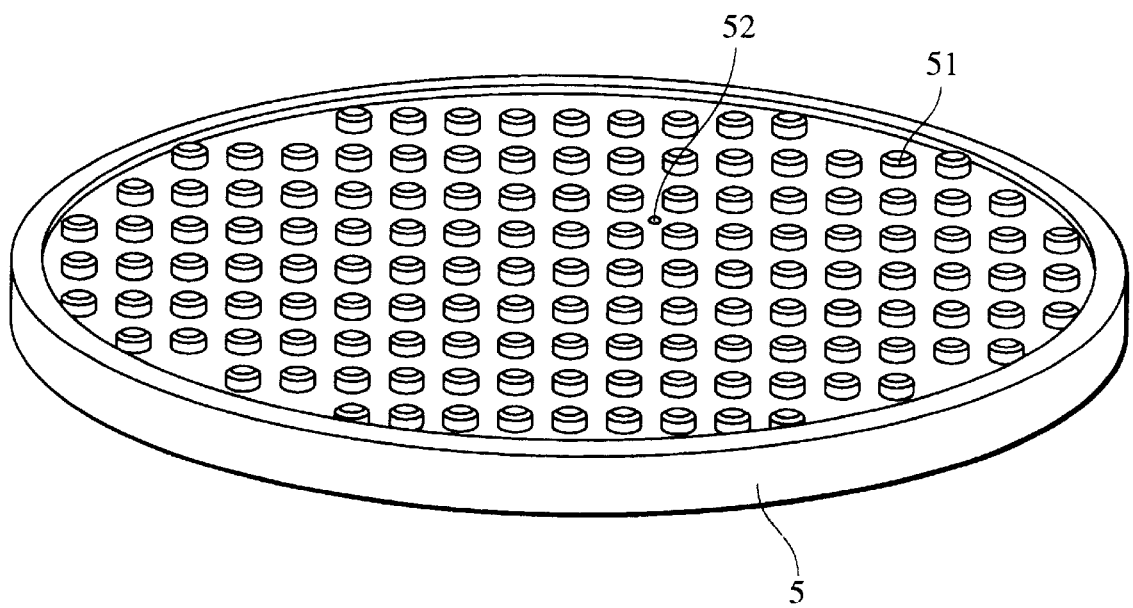
FIG. 1 is a schematic view of a wafer chuck in accordance with an embodiment of the present invention.

FIG. 1 is a schematic view of a wafer chuck of the present invention. The wafer chuck 5 has point-contact-type pins for supporting a wafer (not shown in the drawing). The pin 51 ensures a minimum area of contact with a wafer (not shown in the drawing) in order to avoid incorporation of foreign materials (ex. particles) as much as possible. The wafer chuck 5 has pins 51 and the diameter of each pin 51 ranges from 0.1 mm to 0.2 mm so as to suppress local stress to the wafer.

The pins 51 are arranged in a lattice having a lattice pitch of approximately 2 mm so that the distortion of the wafer is not more than 10 nm. The height of each pin is approximately 30 μm so as to rapidly dissipate the heat of the wafer to the wafer chuck 5. A preferred material for the wafer chuck 5 is silicon carbide (SiC), which is a ceramic material having a low thermal expansion coefficient, high thermal conductivity, and a large specific rigidity.

The wafer chuck 5 is provided with an evacuating hole 52 so that the wafer can be held on the wafer chuck 5 by a vacuum.

A photocatalytic thin film used in the wafer chuck 5 of the present invention will now be described in detail.

The photocatalyst is a catalyst that facilitates a chemical reaction, which usually occurs at several hundred ° C., at room temperature by using light energy. When the surface of a semiconductor that exhibits photocatalytic reaction activity is irradiated with light having a wavelength corresponding to energy that is higher than the band gap of the semiconductor, a photocatalytic reaction is excited to form pairs of electrons and holes in the semiconductor. The electrons react with oxygen in an atmospheric gas to form activated oxygen on the surface, whereas the holes react with water in the atmospheric gas to form protons on the surface. The activated species formed on the surface react with organic components, and the organic components are decomposed and removed by an oxidation-reduction reaction.

Preferred materials for the photocatalyst in this embodiment are ceramics having semiconductor characteristics. Examples of such materials include $TiO_2$, $SnO_2$, $KTaO_3$, CdTe, ZnSe, $BiS_3$, SiC, InP, GaAs, $Cu_2O$, $Fe_2O_3$, GaP, $WO_3$, PbO, $PbO_2$, CdS, Si, $BaTiO_3$, and $SrTiO_3$. These photochemical catalytic materials can be used alone or in combination as a composite.

Figure 2:
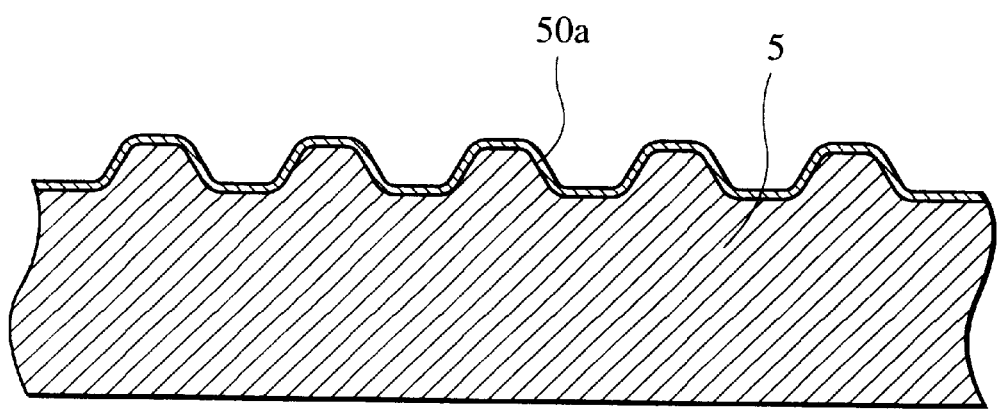
FIG. 2 is a cross-sectional view of a wafer chuck in accordance with an embodiment of the present invention.

FIG. 2 is a cross-sectional view of the wafer chuck 5 of this embodiment.

The SiC wafer chuck 5 has a titanium oxide thin-film 50a having an anatage-type crystal structure thereon. The titanium oxide thin-film 50a is formed by spray coating followed by baking at a low temperature of 800° C. or less. When the baking is performed at a temperature above 800° C., the anatage crystal structure of the titanium oxide changes to a rutile structure, and the photocatalytic effects rapidly disappear. The titanium oxide thin-film 50a has a thickness of approximately 2 μm. In order to suppress fluctuations of the thickness, the operation of a coating nozzle is controlled so that coating is performed several times. The titanium oxide thin film 50a can be formed by a spray coating process, a roll coating process, a dipping process, a spin coating process, a vacuum deposition process, a PVD process, a CVD process, a sputtering process, or an electroplating process.

The band gap of titanium oxide is approximately 3 eV, or 420 nm when converted to wavelength. When the surface of the wafer chuck 5 is irradiated with light having a wavelength of 420 nm or less, the chuck is cleaned by a photocatalytic reaction. Since a thick titanium oxide film causes a decreased light transmittance, the thickness is controlled so that light reaches the entire catalytic region.

When the thickness of the photocatalyst is 20 nm or less, the band gap is larger than 3 eV due to quantum particle size effects.

When the photocatalytic ceramic thin-film having semiconductor characteristics is formed on the surface of the wafer chuck 5 and is irradiated with ultraviolet rays, the photocatalytic effects occur as follows. Static electricity, which is accumulated on the surface of the wafer chuck over time, is instantaneously neutralized. In addition, the surface of the wafer chuck loses hydrophobicity and thus, has low surface free energy. As a result, adhesion of foreign materials on the surface of the wafer chuck is moderated and detachment of the adhered foreign materials is prompted. Moreover, organic gaseous contaminants, such as siloxane and phthalic acid, are decomposed or modified into stabilized gas species.

Figure 3:
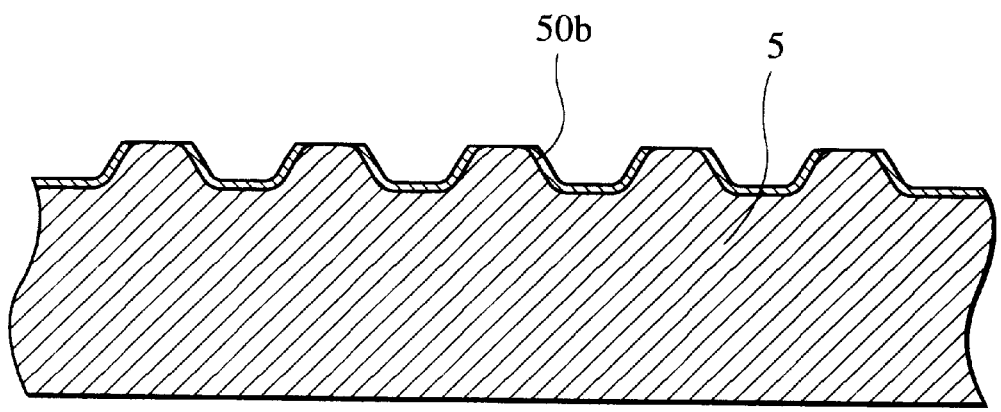
FIG. 3 is a cross-sectional view of a wafer chuck in accordance with a first modification of the embodiment.

FIG. 3 is a cross-sectional view of a first modification of the wafer chuck 5. In this modification, the thin-film uniformly formed on the surface of the wafer chuck 5 is lapped so that the planarity of the planar portions of the wafer chuck is improved and the base material is exposed at the portions in contact with the rear face of the wafer. In such a case, the thin film at the tip of each pin is stripped, and the base material comes into contact with the wafer. Since foreign materials actually adhere to the peripheral region of each pin, a thin-film 50b remaining at the peripheral region of the pin exhibits photocatalytic cleaning effects.

Figure 4:
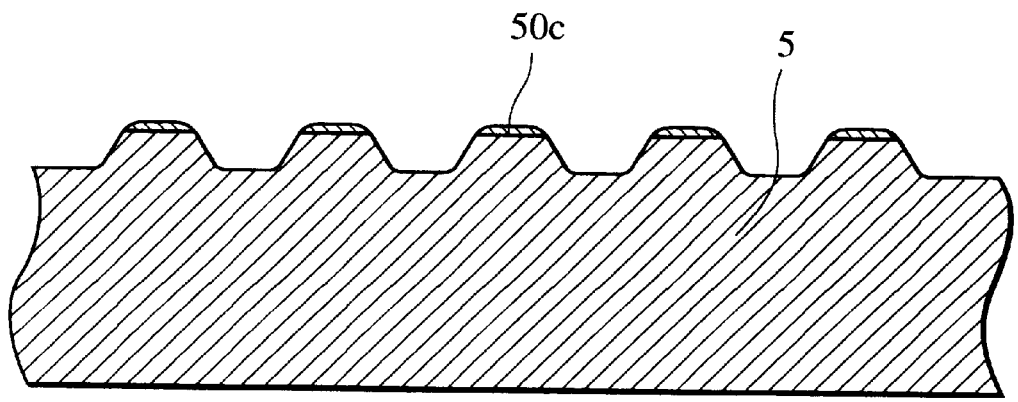
FIG. 4 is a cross-sectional view of a wafer chuck in accordance with a second modification of the embodiment.

FIG. 4 is a cross-sectional view of a second modification of the wafer chuck. In this modification, a titanium oxide photocatalytic thin-film 50c is provided at the tip of each pin which comes into contact with the wafer. This configuration also exhibits photocatalytic effects. When the photocatalytic thin-film is also formed on the peripheral region of the pin, the photocatalytic cleaning effects are further enhanced with respect to foreign materials primarily lying in the peripheral region.

Figure 5:
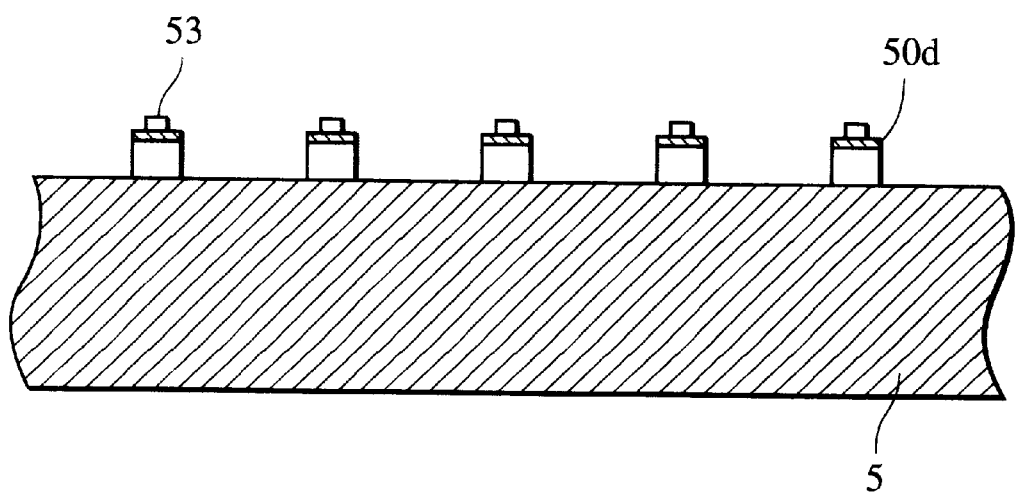
FIG. 5 is a cross-sectional view of a wafer chuck in accordance with a third modification of the embodiment.

With reference to FIG. 5, photocatalytic thin-films 50d may be formed on pins, which have projections 53. When the photocatalytic thin-film 50d is also formed on the peripheral region of each pin, the photocatalytic cleaning effects are further enhanced with respect to foreign materials primarily lying in the peripheral region.

As described above, the wafer chuck having the photocatalytic effects can suppress adhesion of foreign materials on the surface of the wafer and thus, can suppress production of unsuccessful devices, resulting in improved yields in semiconductor device production.

The substrate holding apparatus in this embodiment includes a pin chuck for holding a wafer by a vacuum. Alternatively, a photocatalytic thin-film may be formed on a wafer chuck having evacuating grooves, in place of the pins. The wafer may be held by electrostatic chucking or mechanical chucking, instead of the vacuum chucking.

Embodiments of an Exposure Apparatus

Figure 6:
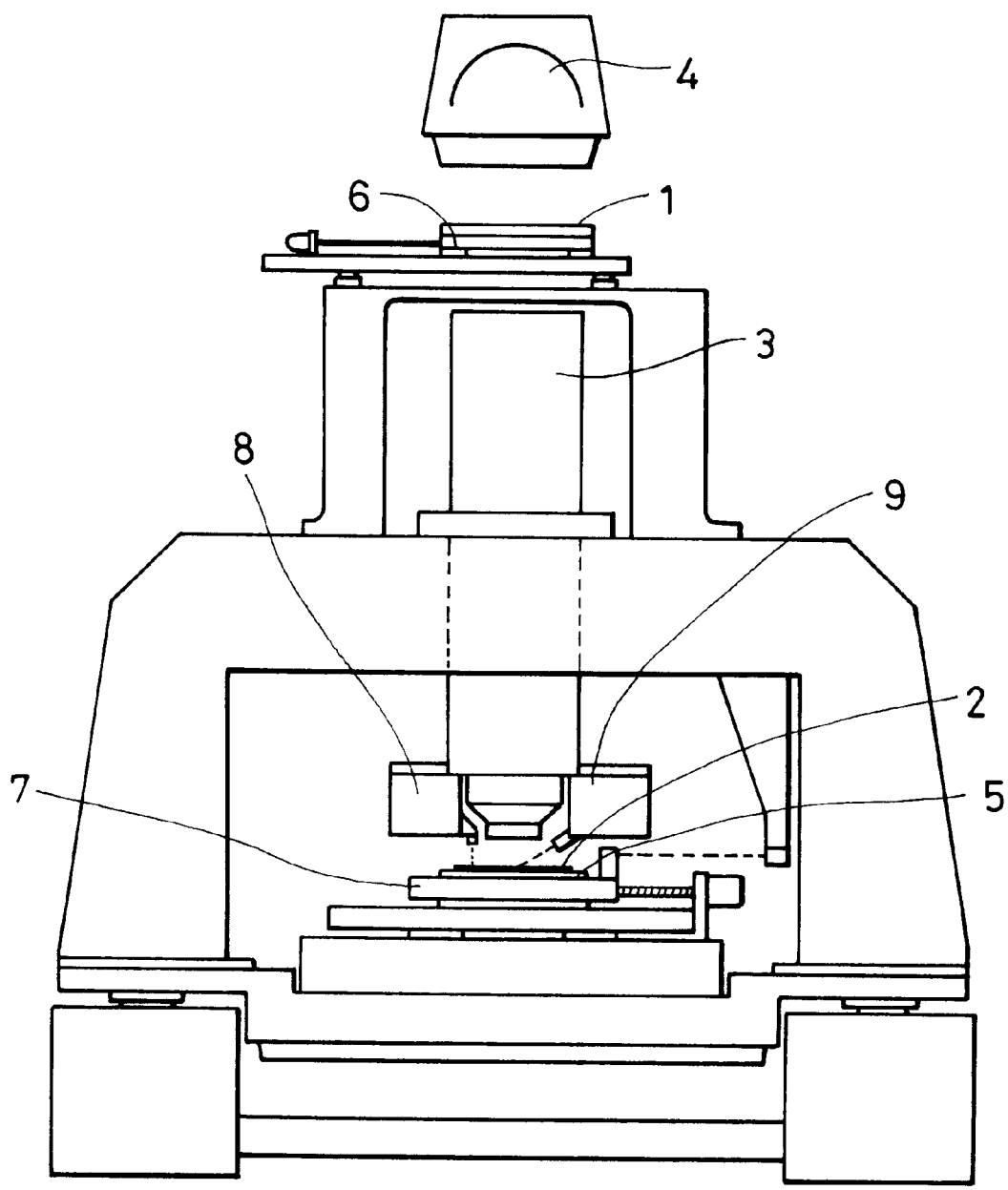
FIG. 6 is a front view of an exposure apparatus in accordance with an embodiment of the present invention.

FIG. 6 shows a reduction projection exposure apparatus using the above wafer chuck 5. A reticle 1 having a pattern to be transferred onto a wafer is placed on a reticle stage 6 and is irradiated with exposure light, which is incident from an illumination optical system 4. The exposure light, which passes through the reticle 1, is reduced to one-fifth by a projection optical system 3 and reaches a silicon wafer 2. The above-described wafer chuck 5, as a substrate holding apparatus for holding the wafer 2, is placed on an XY stage 7, which is transversely movable. A thin resist film, as a photosensitive member, is formed on the wafer to be exposed. The resist film functions as an etching mask in the subsequent steps. In FIG. 6, numeral 8 represents an off-axis scope and numeral 9 represents a measuring means for measuring the position of the wafer surface.

A method for performing exposure using ultraviolet irradiation which induces photocatalytic effects will now be described.

In this embodiment, ultraviolet rays are used as exposure light for reduction projection. That is, i-line light (wavelength 365 nm) from a high-pressure mercury lamp is used. The i-line light is suitable for a photocatalytic reaction when titanium oxide is used as a photocatalyst formed on the surface of the wafer chuck.

An exposure sequence will now be described.

The operation of the exposure apparatus starts based on a start command when the wafer 2 to be exposed is set into the exposure apparatus automatically or manually. The first wafer 2 is transferred by a transfer means onto the wafer chuck 5 placed on the stage 7. The off-axis scope 8 detects alignment marks provided at several positions on the wafer 2 and determines the magnification, the rotation, and the XY misalignment of the wafer to correct the position of the wafer. The stage 7 shifts the wafer 2 so that a first-shot position of the wafer 2 lies at the exposure position of the 7 exposure apparatus. After confirming focusing by the measuring means 9 for measuring the position of the wafer surface, the wafer 2 is exposed for approximately 0.2 seconds. The wafer 2 is moved stepwise so that the second-shot position of the wafer lies at the exposure position, and is then exposed. These steps are repeated before the final shot position is exposed to complete the exposure of the first wafer. The wafer 2 is delivered to a recovery and transfer hand and is moved onto a wafer carrier (not shown).

The exposure sequence in this embodiment includes a chuck irradiation step for irradiating the surface of the chuck with the exposure light after the recovery of the wafer from the wafer chuck and before transfer of the next wafer. Since the intensity of the ultraviolet rays from the projection exposure apparatus is sufficiently high to induce a photocatalytic reaction, the cleaning of the chuck is instantaneously achieved by the exposure light. The chuck may be irradiated with ultraviolet rays for cleaning while being moved stepwise or by scanning the stage.

In this exposure sequence, the cleaning of the wafer is performed between the processing of two wafers. Alternatively, the chuck may be irradiated during a waiting mode or at a predetermined time interval.

Figure 7:
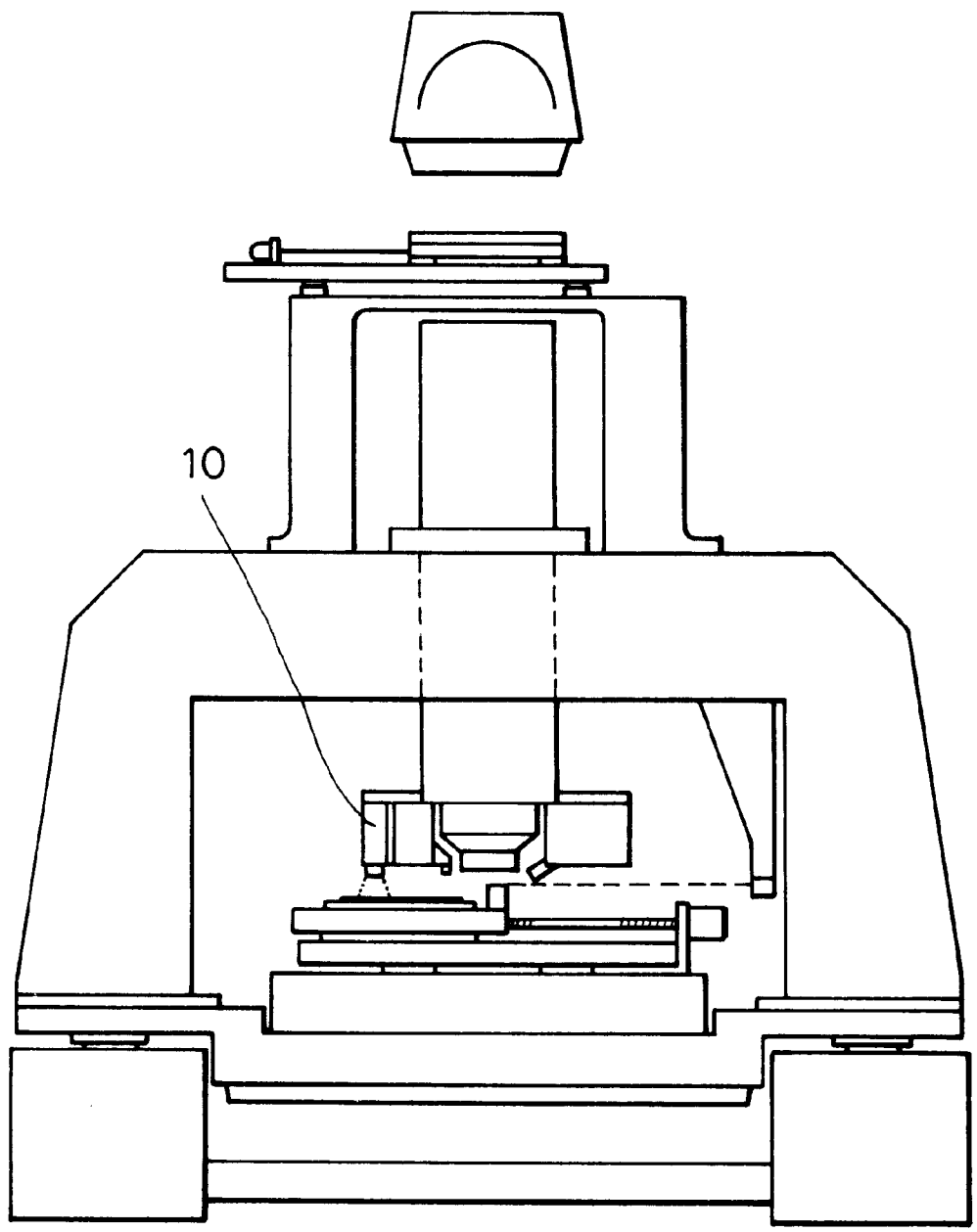
FIG. 7 is a front view of an exposure apparatus in accordance with a modification of the embodiment.

In this embodiment, the chuck is irradiated with the exposure light. In another embodiment, shown in FIG. 7, another ultraviolet irradiation unit 10 may be provided above the wafer chuck. The light source of the ultraviolet irradiation unit 10 may be the same light source as that used for the exposure light or a different light source.

Embodiments of a Transfer Hand

Figure 8:
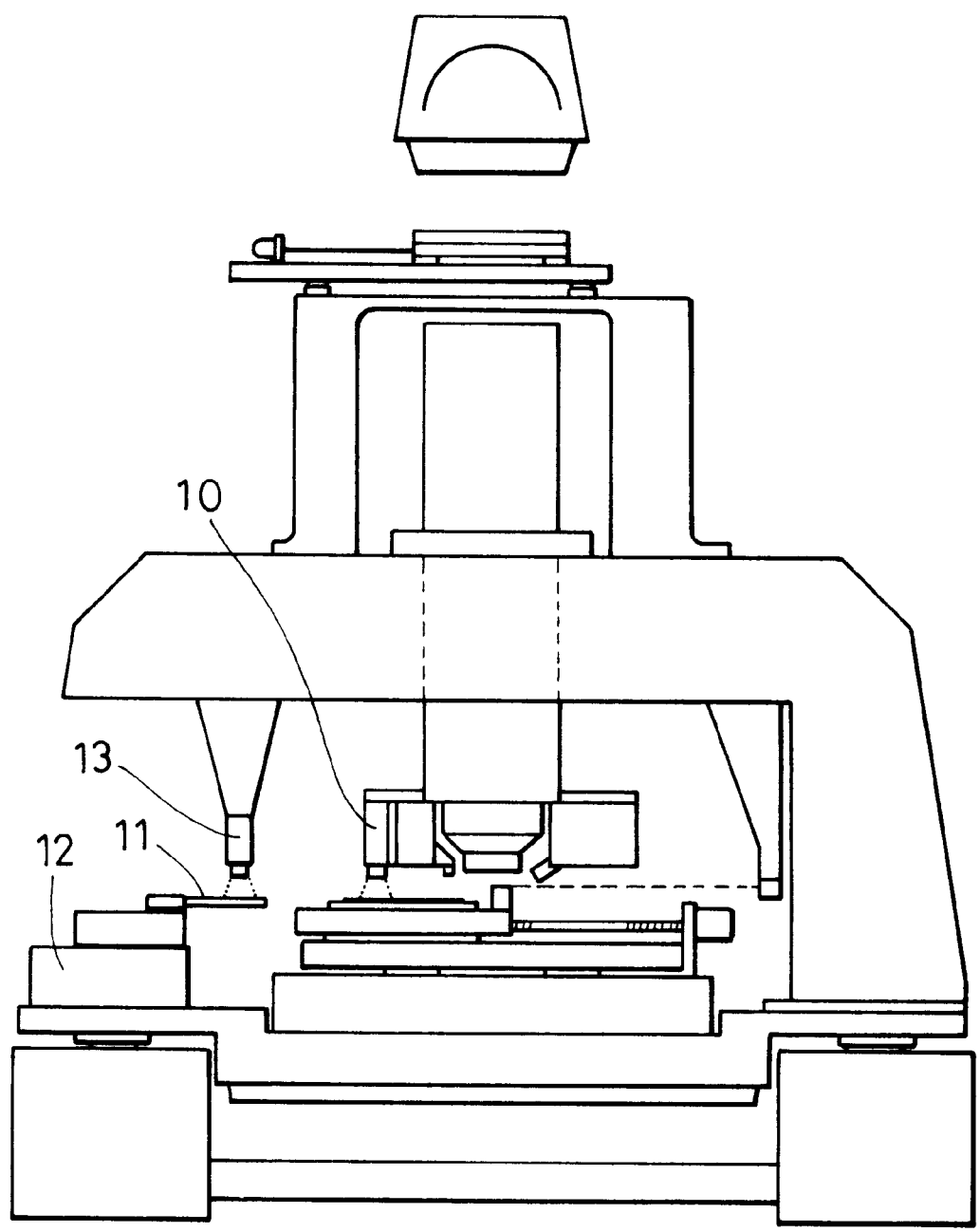
FIG. 8 is an outlined schematic view of a transfer system.

FIG. 8 is a schematic view of a transfer system in accordance with an embodiment of the present invention. This transfer system has a hand for transferring a wafer to a stage, and the hand is provided with a thin film, which induces a photocatalytic reaction.

A transfer robot 12 receives a wafer transferred from a wafer line port (not shown in the drawing) and delivers it to a chuck of the stage. The wafer is held by a hand 11, which is made of a rigid ceramic material. The hand 11 has two or three lands which come into contact with the rear surface of the wafer. The hand 11 holds the rear surface of the wafer at these lands by a vacuum, and transfers the wafer.

In conventional apparatuses, adhesion of foreign materials is concentrated to the lands which come into contact with the wafer, and the foreign materials are transferred to the rear surface of the wafer. In this embodiment, the thin film inducing the photocatalytic reaction is provided at least at positions of the transfer hand which come into contact with the wafer.

An ultraviolet irradiation unit 13 is provided above the transfer hand so that the upper face of the hand is irradiated with ultraviolet rays in a waiting mode of the hand. In FIG. 8, the ultraviolet irradiation unit 13 for irradiating the transfer hand and the ultraviolet irradiation unit 10 for irradiating the wafer chuck are independently provided. Alternatively, an ultraviolet irradiation unit can be provided at a position in which delivery of the wafer is performed between the transfer hand and the wafer chuck so that both the transfer hand and the wafer chuck are irradiated with ultraviolet rays from the ultraviolet irradiation unit.

In this embodiment, the transfer hand (substrate holding apparatus) in the exposure apparatus has the photocatalyst. Alternatively, the photocatalyst may be formed on the handling portions of other transfer means (substrate holding apparatuses) having portions which come into contact with the wafer, and may be activated by ultraviolet irradiation from an ultraviolet irradiation unit.

Embodiments of a Coating and Developing Unit

Figure 9:
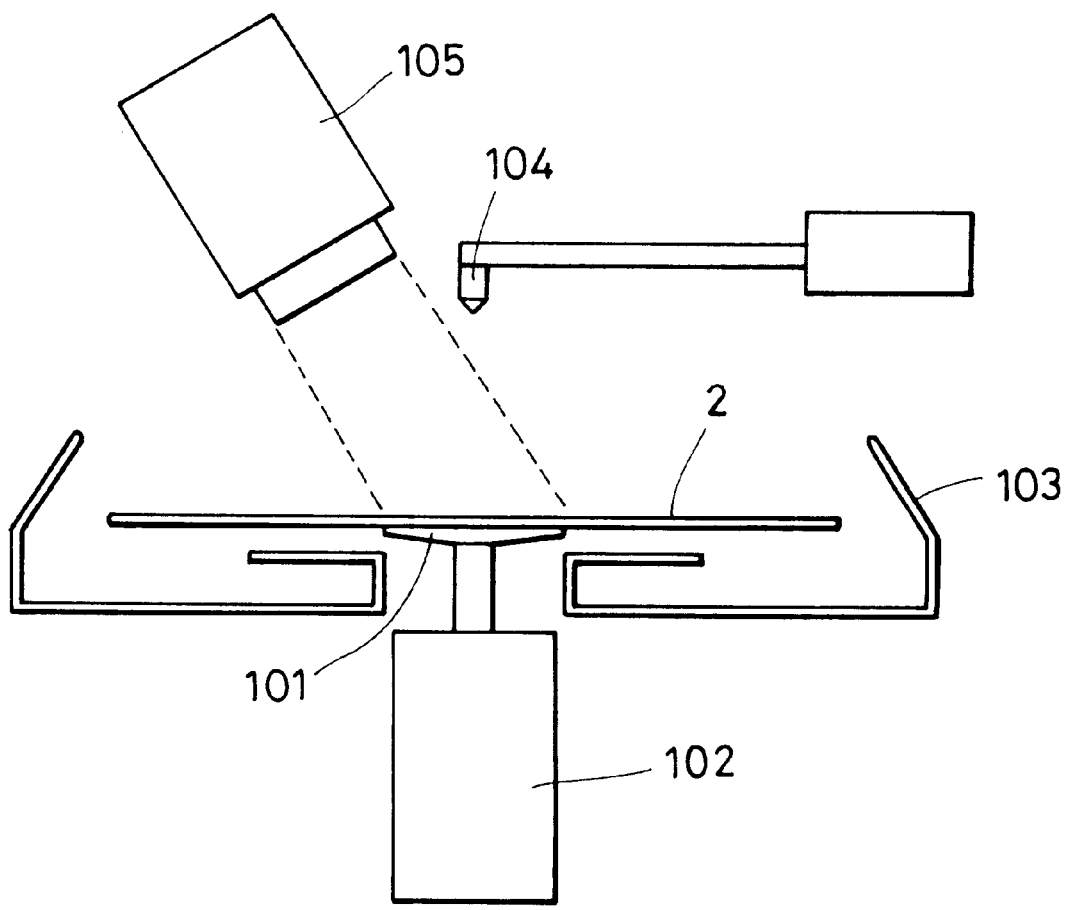
FIG. 9 is an outlined schematic view of a coating and developing unit.

FIG. 9 is an outlined view of a coating and developing unit in accordance with an embodiment of the present invention. A spinning chuck 101 holds a wafer 2 by a vacuum, and rotates at a high speed by a rotation driver 102 provided below the spinning chuck 101. A cup 103 is provided around the spinning chuck to prevent splashing of a coating solution. A resist solution or a developing solution is poured drop-by-drop onto the center of the wafer 2 through a nozzle 104.

In this embodiment, the photocatalytic thin film is formed at least on the face of the spinning chuck 101 (substrate holding apparatus) which comes into contact with the wafer 2 (substrate holding section). An ultraviolet irradiation unit 105 is provided so that the spinning chuck 101 is irradiated with ultraviolet rays from above in a waiting mode of the coating and developing step.

Method for Making a Device

Figure 10:
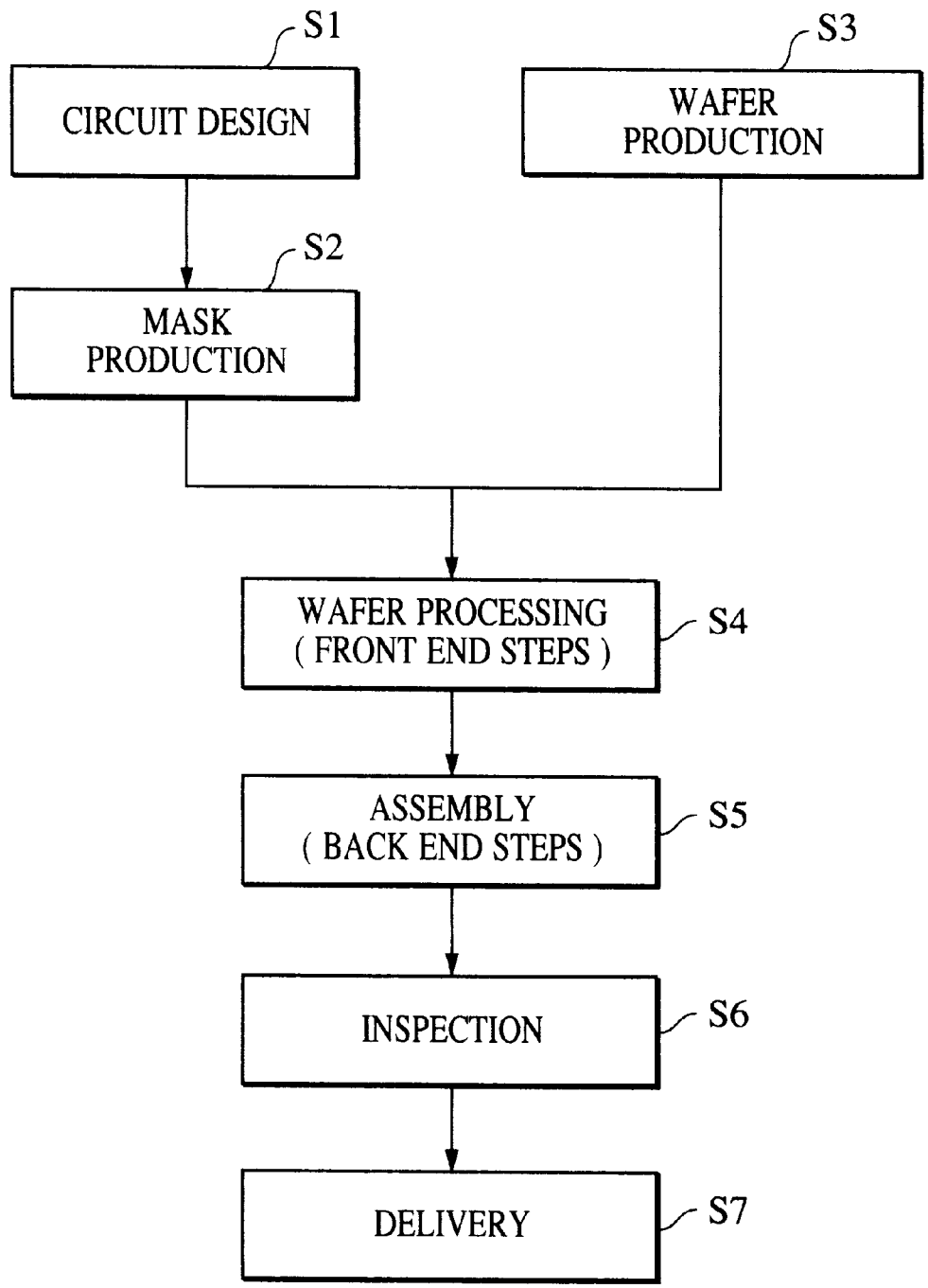
FIG. 10 is a flow chart showing the production of a semiconductor device.

An embodiment of a method for making a semiconductor device using the above exposure apparatus will be described. FIG. 10 is a flow chart showing the production of semiconductor devices, e.g., semiconductor chips such as ICs and LSIs, liquid crystal panels, and CCDs. In step S1 (circuit design), a circuit for a semiconductor device is designed. In step S2 (mask production), a mask of the designed circuit pattern is produced. In step S3 (wafer production), a wafer is produced using a material such as silicon. In step S4 (wafer processing), called front end steps, an actual circuit is formed on the wafer by lithography using the mask. In step S5 (assembly), called back end steps, semiconductor chips are produced using the wafer. Step S5 includes an assembly step (dicing and bonding) and a packaging step (chip encapsulation). In step S6 (inspection), the produced semiconductor devices are subjected to operational testing, and tolerance testing. The semiconductor devices are completed via these steps and are delivered (step S7).

FIG. 11 is a detailed flow chart of the wafer processing discussed above and shown in step S4 of FIG. 10. In step S11 (oxidation), the surface of the wafer is oxidized. In step S12 (CVD), an insulating film is formed on the wafer. In step S13 (electrode formation), electrodes are formed on the wafer by vapor deposition. In step S14 (ion implantation), ions are implanted into the wafer. In step S15 (resist treatment), a resist or a photosensitive member is applied onto the wafer. In step S16 (exposure), the wafer is exposed using an exposure apparatus through the circuit pattern of the mask. In step S17 (development), the exposed wafer is developed. In step S18 (etching), the undeveloped portions of the resist are removed by etching. In step S19 (resist stripping), the remaining resist is removed. These steps are repeated until a multiple-circuit pattern is formed on the wafer. The method in accordance with this embodiment enables the production of highly integrated semiconductor devices, which cannot be produced by conventional processes.

What is claimed is:

1. An exposure apparatus comprising:
   a light source for emitting a light beam to expose a substrate; and
   a substrate holding apparatus having a substrate holding section for holding a substrate, said substrate holding section including a thin film that causes a photocatalytic reaction upon irradiation with light,
   wherein said light source irradiates said substrate holding section with the light beam.

2. An exposure apparatus according to claim 1, further comprising a vacuum chuck for holding the substrate at the substrate holding section by vacuum chucking.

3. An exposure apparatus according to claim 1, wherein the thin film comprises a ceramic material having semiconductor characteristics.

4. An exposure apparatus according to claim 1, wherein the thin film comprises titanium oxide.

5. An exposure apparatus according to claim 4, wherein the titanium oxide is heat-treated at 800° C. or less.

6. An exposure apparatus according to claim 1, further comprising a wafer chuck on which the substrate holding section is provided.

7. An exposure apparatus according to claim 1, further comprising at least one pin supporting the substrate.

8. An exposure apparatus according to claim 7, further comprising a projection provided on the at least one pin.

9. An exposure apparatus according to claim 1, wherein the thin film is formed at least at a position in contact with the substrate.

10. An exposure apparatus according to claim 7, wherein the thin film is formed at the tip of the at least one pin.

11. An exposure apparatus according to claim 1, wherein the thin film is formed on the periphery of a position in contact with the substrate.

12. An exposure apparatus according to claim 11, further comprising at least one pin supporting the substrate, wherein the thin film is formed on the periphery of the at least one pin.

13. An exposure apparatus according to claim 1, further comprising a transfer system, including a hand for transferring a wafer, wherein the substrate holding section is formed at the hand of the transfer system.

14. An exposure apparatus according to claim 13, wherein the hand comprises a ceramic material.

15. An exposure apparatus according to claim 13, wherein the hand is irradiated with ultraviolet rays in a waiting mode.

16. A substrate transfer system comprising an exposure apparatus having a substrate holding apparatus according to claim 13.

17. An exposure apparatus according to claim 1, further comprising a stage for moving the substrate holding apparatus.

18. An exposure apparatus according to claim 1, wherein exposure of the substrate holding apparatus is formed while the stage is moved stepwise.

19. An exposure apparatus according to claim 1, wherein exposure of the substrate holding apparatus is performed while a stage is scanned.

20. An exposure apparatus according to claim 1, wherein the substrate holding apparatus is cleaned by exposure of the substrate holding apparatus.

21. An exposure apparatus according to claim 1, wherein the substrate holding apparatus is exposed with a light beam having a wavelength of 420 nm or less.

22. An exposure apparatus according to claim 21, wherein the light beam is in the i-line.

23. An exposure apparatus according to claim 1, further comprising a light irradiation unit for exposing the substrate holding apparatus.

24. An exposure apparatus according to claim 23, wherein the light irradiation unit introduces a light beam from a light source, the light source being used for transferring a pattern formed in a reticle onto a wafer, to expose the substrate holding apparatus.

25. An exposure apparatus according to claim 23, wherein the light irradiation unit radiates a light beam for transferring a pattern formed in a reticle onto a wafer.

26. An exposure apparatus according to claim 1, wherein the substrate holding section is provided in a coating unit for applying a resist solution or a developing solution onto the substrate.

27. A coating unit comprising an exposure apparatus having a substrate holding apparatus according to claim 1.

28. A coating unit according to claim 27, wherein a resist solution or a developing solution is applied onto the substrate.

29. A method of making a device comprising the steps of:

providing an exposure apparatus according to claim 1;

transferring a pattern formed in a reticle onto a wafer; and exposing the substrate holding apparatus with light, causing a photocatalytic reaction.

30. A method of making a device according to claim 29, further comprising the steps of applying a resist onto the wafer using a coating, and developing the exposed wafer.

31. A method of cleaning a substrate holding apparatus having a substrate holding section for holding a substrate, said method comprising the steps of:

providing the substrate holder with a thin film of separated segments, which causes a photocatalytic reaction upon irradiation with light;

moving the substrate holding section into an irradiation region of a light irradiation unit; and irradiating the substrate holding section with light from the light irradiation unit.

32. A method of cleaning a substrate holding section according to claim 31, further comprising irradiating the substrate holding section with the light by using an optical system of exposure apparatus.

* * * * *

UNITED STATES PATENT AND TRADEMARK OFFICE
CERTIFICATE OF CORRECTION

PATENT NO.      : 6,307,620 B1
DATED           : October 23, 2001
INVENTOR(S)     : Yukio Takabayashi et al.

It is certified that error appears in the above-identified patent and that said Letters Patent is hereby corrected as shown below:

<u>Column 6,</u>
Line 24, "7" should be deleted.

<u>Column 9,</u>
Line 5, "formed" should read -- performed --.

Signed and Sealed this

Ninth Day of July, 2002

Attest:

Attesting Officer

JAMES E. ROGAN
Director of the United States Patent and Trademark Office